(12) United States Patent
Lu et al.

(10) Patent No.: US 10,424,546 B1
(45) Date of Patent: Sep. 24, 2019

(54) ELECTROMAGNETIC INTERFERENCE ABSORBER RING

(71) Applicant: Arista Networks, Inc., Santa Clara, CA (US)

(72) Inventors: Duong Lu, Santa Clara, CA (US); Jiayi Wu, Santa Clara, CA (US); Robert Wilcox, Santa Clara, CA (US); Richard Hibbs, Santa Clara, CA (US); Paul Miller, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 15/980,068

(22) Filed: May 15, 2018

Related U.S. Application Data

(62) Division of application No. 15/227,838, filed on Aug. 3, 2016, now Pat. No. 9,972,577.

(51) Int. Cl.
*H01L 23/10* (2006.01)
*H01L 23/552* (2006.01)
*H01L 21/48* (2006.01)
*H01L 23/498* (2006.01)

(52) U.S. Cl.
CPC ........ *H01L 23/552* (2013.01); *H01L 21/4817* (2013.01); *H01L 23/49816* (2013.01)

(58) Field of Classification Search
CPC .............................................. H01L 2924/3025
See application file for complete search history.

(56) References Cited

U.S. PATENT DOCUMENTS

| | | | | |
|---|---|---|---|---|
| 4,465,984 A * | 8/1984 | McDowell | | H01J 23/30 315/3.5 |
| 6,106,379 A * | 8/2000 | Mosca | | B24B 37/30 156/345.14 |
| 7,161,239 B2 * | 1/2007 | Zhao | | H01L 23/24 257/706 |
| 2007/0030626 A1 * | 2/2007 | Barnett | | H01G 4/33 361/311 |
| 2011/0186348 A1 * | 8/2011 | Liao | | H05K 5/00 174/559 |
| 2014/0209374 A1 * | 7/2014 | Song | | H01L 23/552 174/388 |
| 2015/0333019 A1 * | 11/2015 | Lee | | H01L 23/66 257/508 |

* cited by examiner

*Primary Examiner* — Thao P Le
(74) *Attorney, Agent, or Firm* — Womble Bond Dickinson (US) LLP

(57) ABSTRACT

An electromagnetic interference absorber for an integrated circuit is provided. The absorber includes a geometric ring of electromagnetic energy absorbing material, dimensioned to fit over a ball grid array (BGA) integrated circuit package assembled to a substrate. The geometric ring has at least one projection arranged to fit into a gap between the substrate and a body of the BGA integrated circuit package so as to retain the geometric ring to the BGA integrated circuit package. Methods to contain electromagnetic interference and to manufacture an electromagnetic interference absorber are also provided.

14 Claims, 4 Drawing Sheets

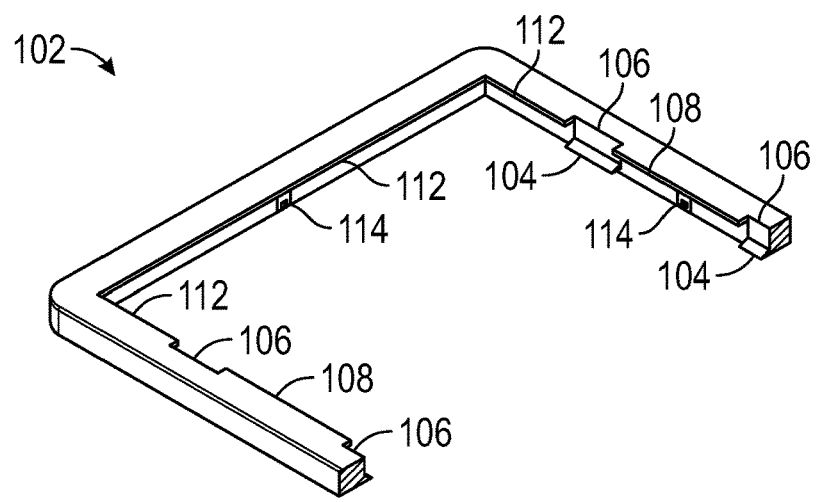
FIG. 3
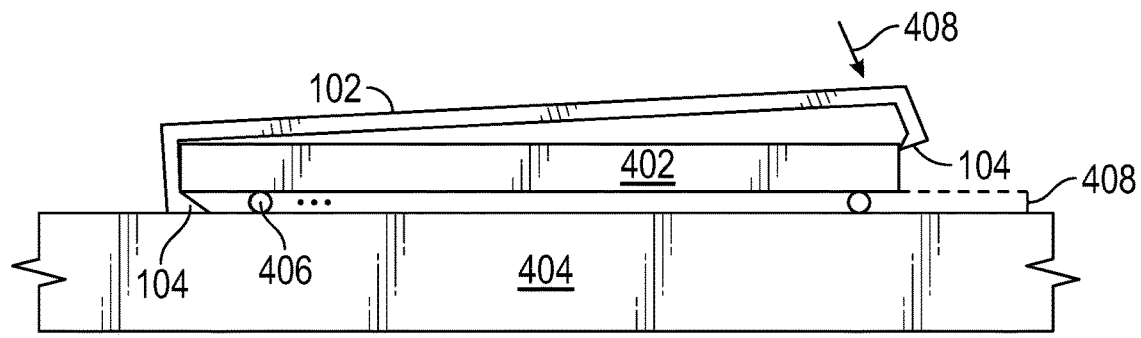
FIG. 4A
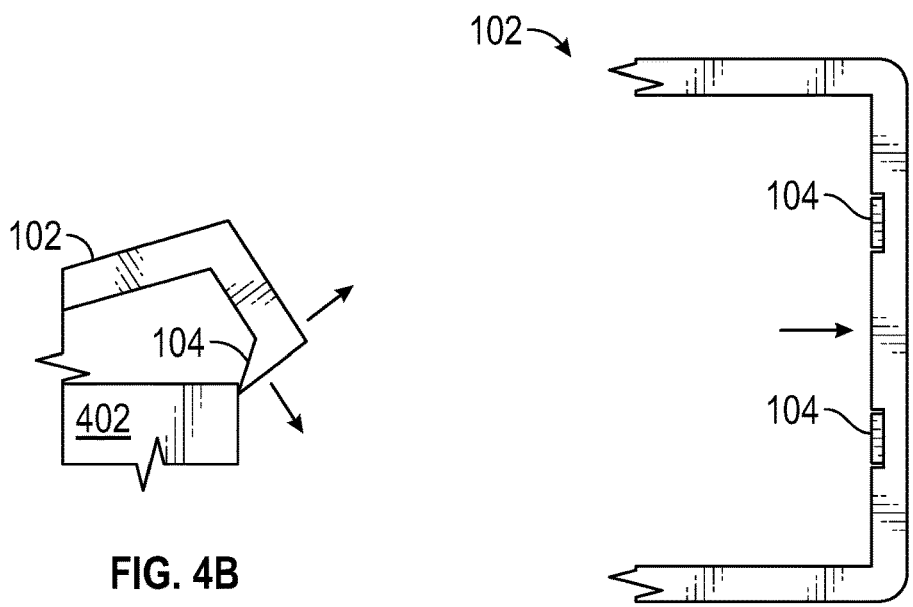
FIG. 4B
FIG. 4C

ELECTROMAGNETIC INTERFERENCE ABSORBER RING

BACKGROUND

Electronic circuits radiate electromagnetic energy, which can manifest as electromagnetic interference in other circuits nearby in the same electronic device, and in other devices. In addition, FCC (Federal Communications Commission) regulations specify limits to electromagnetic interference produced by various electronic devices. Accordingly, it would be desirable to develop various embodiments that can reduce, isolate, contain or block electromagnetic radiation.

SUMMARY

In some embodiments, an electromagnetic interference absorber for an integrated circuit is provided. The absorber includes a geometric ring of electromagnetic energy absorbing material, dimensioned to fit over a ball grid array (BGA) integrated circuit package assembled to a substrate. The geometric ring has at least one projection arranged to fit into a gap between the substrate and a body of the BGA integrated circuit package so as to retain the geometric ring to the BGA integrated circuit package.

In some embodiments, a method for containing electromagnetic interference from an integrated circuit is provided. The method includes positioning a geometric-shaped ring made of electromagnetic energy absorbing material proximate to a ball grid array (BGA) integrated circuit package that is assembled to a substrate. The method includes deforming the geometric-shaped ring until one or more wedges of a base of the geometric-shaped ring fit into a gap between the substrate and the BGA integrated circuit package and hold the geometric-shaped ring to the BGA integrated circuit package.

In some embodiments, a method for making an electromagnetic interference absorber is provided. The method includes introducing an electromagnetic energy absorbing material into a mold and forming, in the mold, a geometric-shaped ring made of the electromagnetic energy absorbing material and deformable to fit over a ball grid array (BGA) integrated circuit package. The method includes forming one or more projections extending inward from a base of the geometric-shaped ring, with the one or more projections configured to insert into a gap between the BGA integrated circuit package and a substrate.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 3 is a perspective cutaway view of the electromagnetic interference absorber of FIG. 1 in accordance with some embodiments.

FIG. 4A is a side cross-section view of a further embodiment of the electromagnetic interference absorber snap fitting onto a ball grid array integrated circuit package in accordance with some embodiments.

FIG. 4B is a close-up side cross-section view of the electromagnetic interference absorber deforming during the installation depicted in FIG. 4A in accordance with some embodiments.

FIG. 4C is a top view of the electromagnetic interference absorber deforming during the installation depicted in FIG. 4A in accordance with some embodiments.

DETAILED DESCRIPTION

An electromagnetic interference (EMI) absorber described herein has various features for use with an integrated circuit package. Protruding features, such as one or more wedges in some embodiments, engage a gap below the integrated circuit package to retain the electromagnetic interference absorber to the integrated circuit package, without the use of adhesives or straps, fasteners, springs or other mechanical retention devices. Dimensions of the electromagnetic interference absorber are chosen to position electromagnetic energy absorbing material close or proximate to the integrated circuit package and proximate to or in parts of a gap between the integrated circuit package and a printed circuit board or other substrate, from which gap electromagnetic energy can radiate. The electromagnetic interference absorber distorts or deforms and snap fits over the integrated circuit package, in some embodiments with the use of a tool and in others, without use of a tool. In some embodiments a snap fit refers to applying a pressure to the absorber to deform the absorber and snap the absorber into place around the integrated circuit package. Some embodiments of the electromagnetic interference absorber attach a heat sink to the integrated circuit package.

Figure 1:
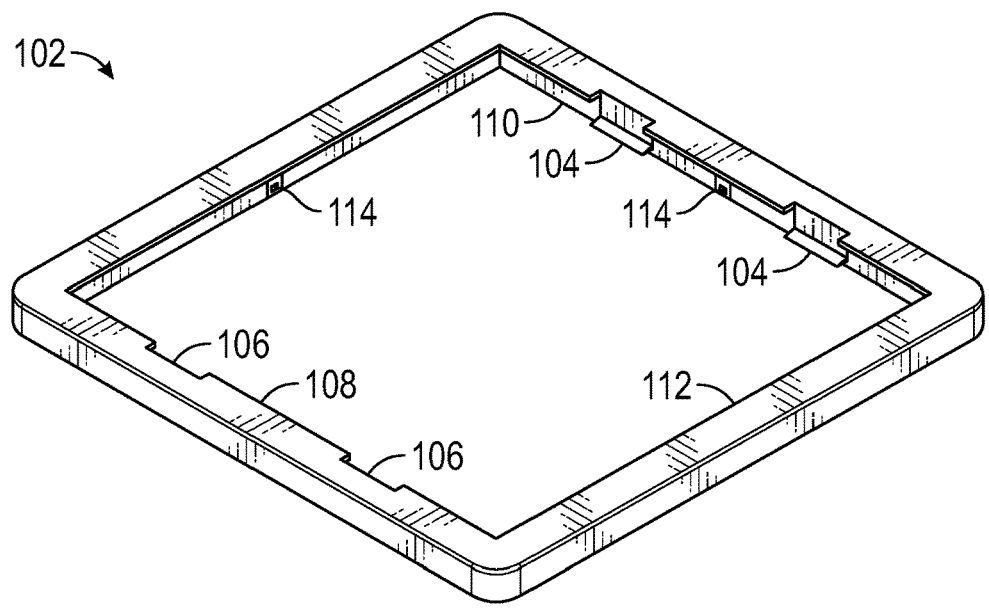
FIG. 1 is a perspective view of an electromagnetic interference (EMI) absorber that fits to an integrated circuit package and decreases electromagnetic energy radiated from a gap between the integrated circuit package and a substrate, such as a printed circuit board in accordance with some embodiments.

FIG. 1 is a perspective view of an electromagnetic interference absorber 102 that fits around an integrated circuit package (see FIGS. 4A-6) and decreases electromagnetic energy radiated from a gap between the integrated circuit package and a substrate, such as a printed circuit board. Various embodiments have some, or all of the following features. The electromagnetic interference absorber 102 is in the shape of a geometric ring, in this embodiment, a rectangular ring. The ring is dimensioned to closely fit around the outer perimeter of an integrated circuit package, and is made of electromagnetic energy absorbing material. It should be appreciated that the embodiments are not limited to the example of a rectangular ring as the absorber may take the form of any suitable geometric shape configured to surround the outer periphery of an integrated circuit package.

One or more protrusions, in some embodiments, wedges 104, extend inwardly from a base 110 and inner perimeter of the rectangular ring. These wedges 104 or other protrusions fit into the gap defined between the integrated circuit package and a printed circuit board to which the integrated circuit package is affixed, to secure the electromagnetic interference absorber 102 to the integrated circuit package, as is further described below with reference to FIGS. 4A-5. One or more notches 106 or protrusions 108 in, or extending from, an upper, inner perimeter of the rectangular ring are arranged and dimensioned to fit a tool used in installing the electromagnetic interference absorber 102 to the integrated circuit package, as is further described below with reference to FIG. 8. A lip 112 extends inwardly from an upper, inner perimeter of the rectangular ring, and is arranged and dimensioned to seat to the top of the integrated circuit package, or in some embodiments to the top of a heat sink as is described below with reference to FIG. 6. One or more posts 114 extend inwardly from the inner perimeter of the rectangular ring. These posts 114 inhibit vibration of the rectangular ring when installed to an integrated circuit package, over a range of manufacturing tolerances of the rectangular ring and the integrated circuit package. Various embodiments have various combinations of posts 114 on inner walls of the sides of the rectangular ring-shaped electromagnetic interference absorber 102. For example, one wall could have one or more posts 114. Two opposed walls could each have one or more posts 114. All four walls of the rectangular ring could each have one or more posts 114. Other geometric shapes could have various numbers of posts on various numbers of walls.

Figure 2:
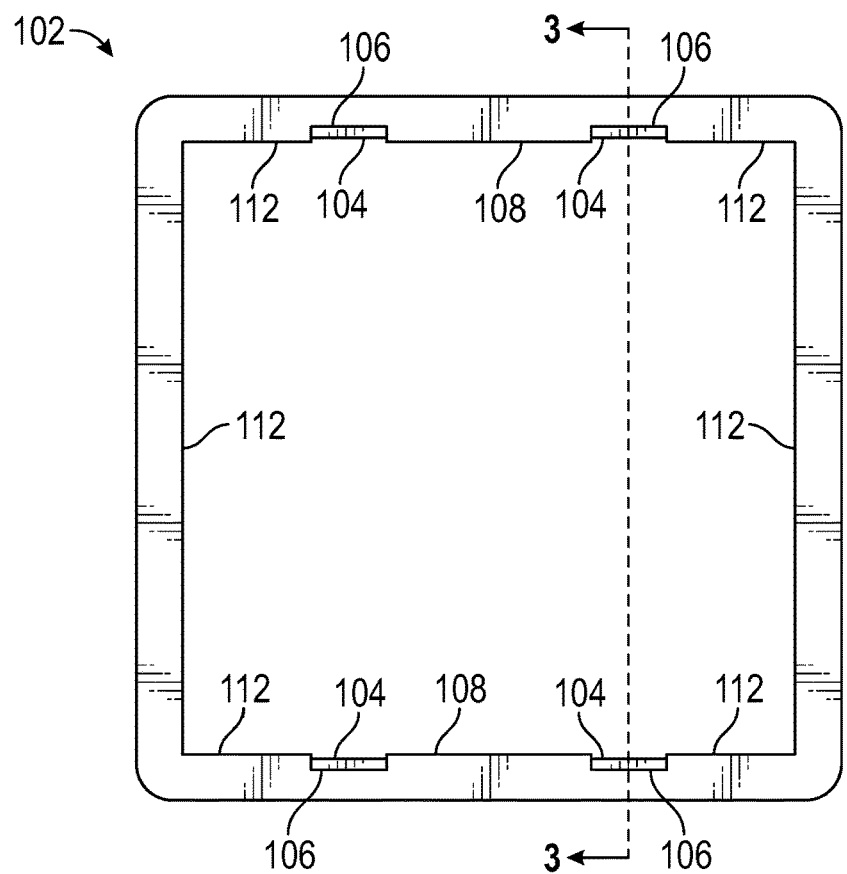
FIG. 2 is a top view of the electromagnetic interference absorber of FIG. 1, indicating a cutaway line in accordance with some embodiments.

FIG. 2 is a top view of the electromagnetic interference absorber 102 of FIG. 1, indicating a cutaway line. The rectangular ring shape, which would closely conform to the shape and dimensions of an integrated circuit package, is illustrated. The cutaway line intersects the wedges 104 and notches 106 of opposed sides of the rectangular ring. Notches 106 and wedges 104 are aligned with each other at corresponding top and bottom surfaces of absorber 102 but this is not meant to be limiting as alternative configurations with the corresponding notches and wedges aligned or not aligned are contemplated.

FIG. 3 is a perspective cutaway view of the electromagnetic interference absorber 102 of FIG. 1. The cutaway, made along line C shown in FIG. 2, reveals cross-sections of the wedges 104 and the notches 106. Protrusions 108 and further portions of the lip 112 are visible around the upper rim of the rectangular ring. Post 114 extends inward from an inner surface of the absorber. Post 114 may also be any suitable geometric shape and extends inward to account for manufacturing tolerances and minimize vibration. In addition, post 114 may extend from one or more of the inner surfaces of the geometric ring in some embodiments. In other embodiments, multiple posts 114 may extend from one or more of the inner surfaces of the geometric ring in some embodiments. It should be appreciated that numerous combinations of wedges 104, notches 106 and posts 114 may be integrated into the embodiments and the examples illustrated are not meant to limit those combinations.

FIG. 4A is a side cross-section view of a further embodiment of the electromagnetic interference absorber 102 snap fitting onto a ball grid array integrated circuit package 402. The integrated circuit package 402 is attached, by solder balls 406, to a printed circuit board 404 or other substrate. A gap 408 between the printed circuit board 404 and the integrated circuit package 402, as well as the periphery of the integrated circuit package, are sources of electromagnetic energy radiated from the integrated circuit and the solder balls 406. On the left side of the drawing, one wedge 104 of the electromagnetic interference absorber 102 is seen fitting under the integrated circuit package 402 and into the gap 408. Pressing in a downward direction 408 on an opposite portion of the electromagnetic interference absorber 102 moves that side with another wedge 104 on the right side of the drawing downward, so that the wedge 104 can fit under the integrated circuit package 402 and into the gap 408 much like the wedge 104 on the left side of the drawing. This embodiment is made of a suitably deformable material, such as plastic, so that deformation of a portion of the rectangular/geometric ring allows the ring to slip over the integrated circuit package 402 and conform closely to the integrated circuit package 402 once seated. In some embodiments, assembly of the electromagnetic interference absorber 102 to the integrated circuit package 402 is performed manually without a tool, and does not need the notches 106 in the rim of the electromagnetic interference absorber 102 for tool alignment, although the notches 106 (see FIGS. 1-3) may aid in flexing the side(s) of the rectangular ring in some embodiments (see FIG. 4C). In some embodiments, assembly of the electromagnetic interference absorber 102 to the integrated circuit package 402 is performed with a tool. Some versions of this use the notches 106 and/or projection 108 for alignment of the tool, and some versions are applied with a tool but do not need such notches 106.

Figure 4D:
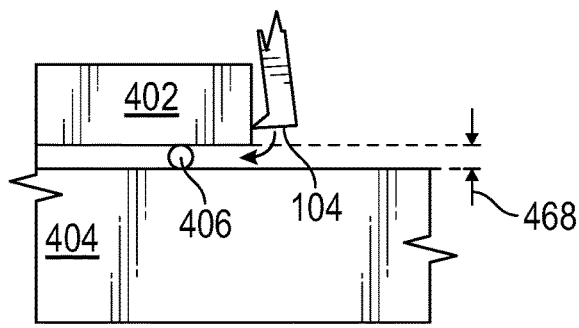
FIG. 4D is a close-up side cross-section view of one of the wedges moving downward along a side of the ball grid array integrated circuit package to fit into the gap between the ball grid array integrated circuit package and a printed circuit board in accordance with some embodiments.

FIG. 4B is a close-up side cross-section view of the electromagnetic interference absorber 102 deforming during the installation depicted in FIG. 4A. Here, the deformation occurs in a vertical wall of the rectangular ring, displacing the wedge 104 outward so that the wedge 104 can be moved downward along or just outside of a perimeter wall of the integrated circuit package 402 as depicted in FIG. 4D.

FIG. 4C is a top view of the electromagnetic interference absorber 102 deforming during the installation depicted in FIG. 4A. Here, the deformation occurs along one or more sides of the rectangular/geometric ring, so that the side of the ring flexes outward and displaces the wedge(s) 104 of that side outward. With the wedge(s) 104 so displaced, the wedge(s) 104 clear the edge of the integrated circuit package 402 and can be moved downward along or just outside of the perimeter wall of the integrated circuit package 402 as depicted in FIG. 4D.

FIG. 4D is a close-up side cross-section view of one of the wedges 104 moving downward along a side of the ball grid array integrated circuit package 402 to fit into the gap 408 between the ball grid array integrated circuit package 402 and a printed circuit board 404. The wedge, and a vertical and/or lateral portion of a side of the rectangular ring-shaped electromagnetic interference absorber 102 is displaced due to deformation as depicted in one or both of FIGS. 4B and 4C. As the wedge 104 moves downward and a tip of the wedge 104 clears the corner at the juncture of the vertical perimeter wall and the bottom surface of the integrated circuit package 402, the wedge 104 snaps into place in the gap 408 (see FIG. 5). Once snapped into place, the peripheral side and the gap 408 is covered by the absorber ring to reduce/minimize reduce electromagnetic interference.

Figure 5:
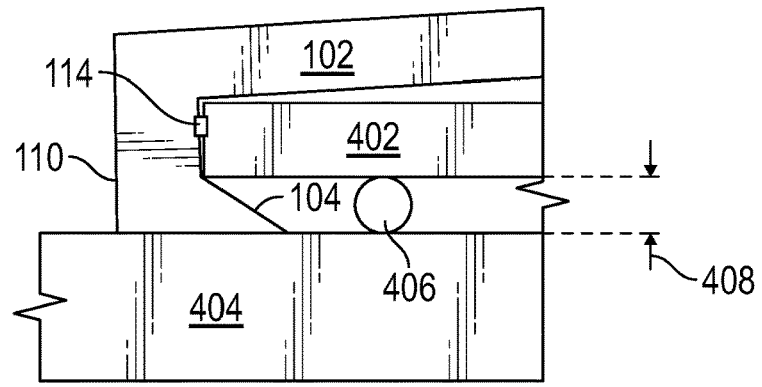
FIG. 5 is a close-up cross-section view of a wedge at the base of the electromagnetic interference absorber fitting into the gap between the ball grid array integrated circuit package and a printed circuit board in accordance with some embodiments.

FIG. 5 is a close-up cross-section view of a wedge 104 at the base of the electromagnetic interference absorber 102 fitting into the gap 408 between the ball grid array integrated circuit package 402 and a printed circuit board 404. In this embodiment, every wedge 104, on however many sides of the geometric ring that have wedges, including the initially seated wedge at the left in FIG. 4A and the later-seated wedge(s) at the right in FIG. 4A and in FIGS. 4B-4D, appears when the electromagnetic interference absorber 102 is secured to the integrated circuit package 402. The sloped surface of the wedge 104 encourages the bottom of the base 110 of the electromagnetic interference absorber 102 to press onto the top surface of the printed circuit board 404, and resist removal from the integrated circuit package 402 in some embodiments. This arrangement places electromagnetic energy absorbing material, of which the electromagnetic interference absorber 102 is made, proximate to or in the gap 408 and close to the integrated circuit package 402, so the electromagnetic energy absorbing material can absorb and thus decrease radiating electromagnetic energy. The electromagnetic interference absorber 102 also surrounds or encases the peripheral side edge of the integrated circuit package 402 to further reduce/minimize electromagnetic interference. Post 114 may provide further stability to prevent movement of electromagnetic interference absorber 102 and compensate for manufacturing tolerances for the integrated circuit package.

Figure 6:
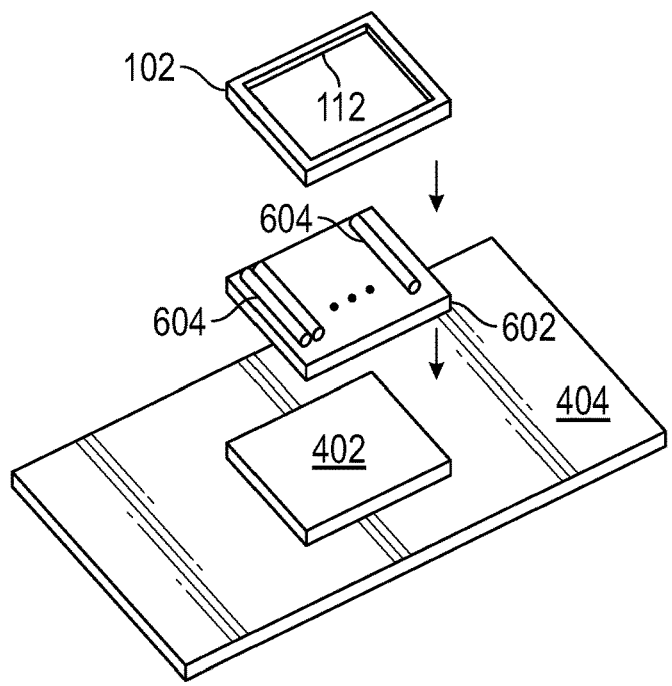
FIG. 6 is a perspective view of a further embodiment of the electromagnetic interference absorber assembling a heat sink to an integrated circuit package attached to a printed circuit board in accordance with some embodiments.

FIG. 6 is a perspective view of a further embodiment of the electromagnetic interference absorber 102 assembling a heat sink 602 to an integrated circuit package 402 attached to a printed circuit board 404. Fins 604 on the heat sink 602 radiate thermal energy, although other types and styles of heat sinks 602 could be used. The lip 112 of the electromagnetic interference absorber 102 seats to an upper surface and perimeter of the heat sink 602 in this embodiment. When assembled to the integrated circuit package 602, the electromagnetic interference absorber 102 secures itself and the heat sink 602 to the integrated circuit package 402. It should be appreciated that numerous heat sink configurations may be accommodated through the embodiments.

Figure 7:
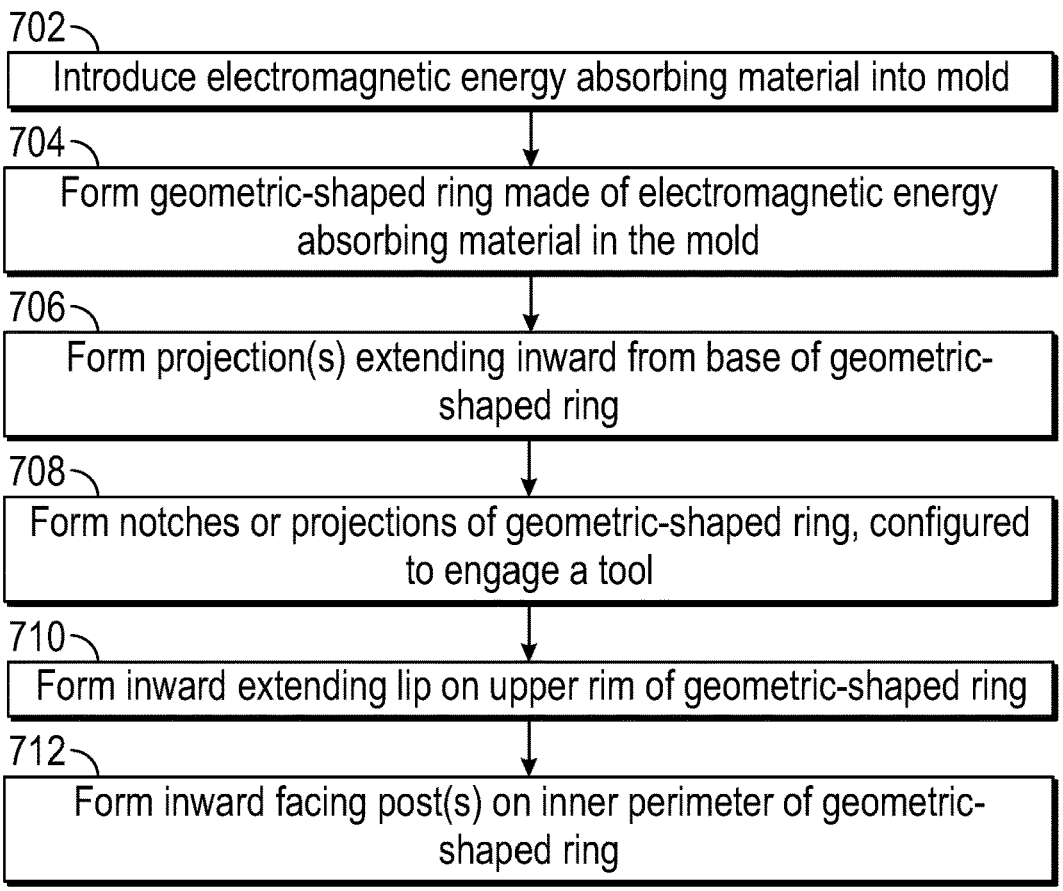
FIG. 7 is a flow diagram of a method of making an electromagnetic interference absorber in accordance with some embodiments.

FIG. 7 is a flow diagram of a method of making an electromagnetic interference absorber. In some embodiments of this method, injection molding is used to introduce electromagnetic energy absorbing material into a mold. For example, ferrite in thermoplastic could be used for injection molding. Other carriers for ferrite or other electromagnetic interference absorbing particles or beads for other types of molding could include epoxy resins, polymers and various further types of plastics and synthetic rubber. Further methods, such as shaping, cutting, carving or building up electromagnetic energy absorbing material to make an electromagnetic interference absorber as shown in FIGS. 1-6 are readily devised in keeping with the teachings herein. Preceding the action 702, a mold that has a shape of a geometric ring is prepared. In various embodiments, the mold is prepared with mold features that correspond to and produce various combinations of features of embodiments described above with reference to FIGS. 1-6. In an action 702, electromagnetic energy absorbing material is introduced into the mold. For example, injection molding can be used. Other molding techniques can be used as well. The material can be ferrite in thermoplastic, or other energy absorbing material in other carriers. Actions 702-712, or various combinations of action 702 and one or more of actions 704-712, produce an electromagnetic interference absorber, which can be used as described below with reference to FIG. 8.

In an action 704, a geometric-shaped ring made of electromagnetic energy absorbing material is formed, in the mold. The ring is shaped to conform to an integrated circuit package. One or more of the remaining actions 706-712 can be performed in combination with the action 704, in the mold, for example with the mold defining various features of the geometric-shaped ring. In some embodiments, one or more of the remaining actions 706-712 can be performed by tooling the product produced by the molding, adding, subtracting, moving or otherwise shaping material. In an action 706, one or more projections are formed, extending inward from the base of the geometric-shaped ring. For example, one or more projections could be formed with each in the shape of a wedge as depicted in FIGS. 1-5. In an action 708, one or more notches or projections of the geometric-ring are formed. These notches are configured to engage a tool in some embodiments. In an action 710, an inward extending lip is formed on the upper rim of the geometric-shaped ring. This lip is configured to conform to the integrated circuit package, or in some embodiments, a heat sink to be attached to the integrated circuit package. In an action 712, one or more inward facing posts are formed on the inner perimeter of the geometric-shaped ring. These posts are configured to inhibit vibration of the geometric-shaped ring, when mounted to the integrated circuit package in some embodiments.

Figure 8:
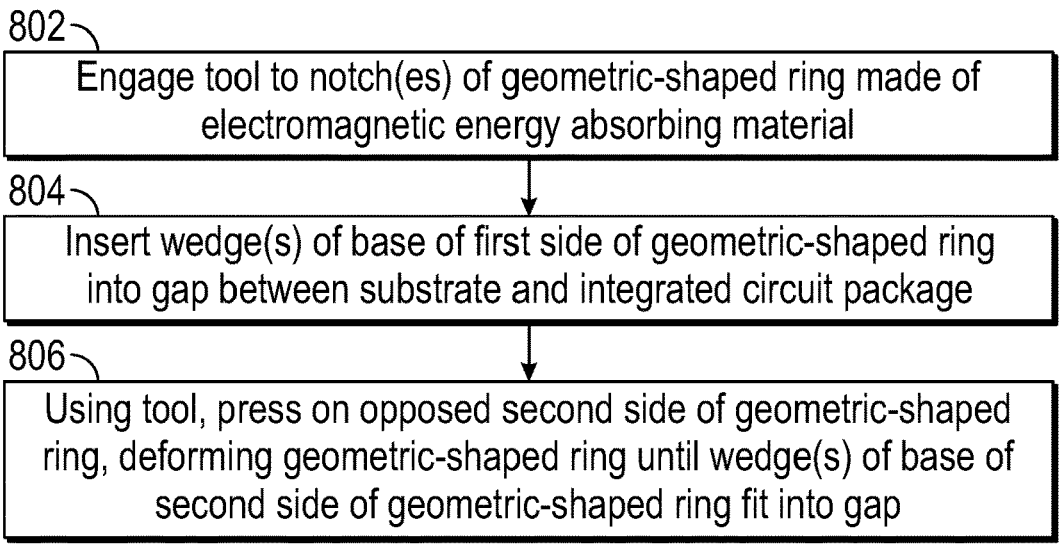
FIG. 8 is a flow diagram of a method of containing electromagnetic interference from an integrated circuit, using an electromagnetic interference absorber in accordance with some embodiments.

FIG. 8 is a flow diagram of a method of containing electromagnetic interference from an integrated circuit, using an electromagnetic interference absorber. The method can be performed by a person or by a machine, using various embodiments of the electromagnetic interference absorber, including products of the process described above with reference to FIG. 7. In an action 802, a tool is engaged to one or more notches of the geometric-shaped ring. The geometric-shaped ring is made of electromagnetic energy absorbing material. In a variation, the tool is engaged to one or more projections of the geometric-shaped ring. It should be appreciated that use of the tool is optional.

In an action 804, one or more wedges of the base of a first side of the geometric-shaped ring are inserted into a gap between a substrate and an integrated circuit package. Then, in an action 806, a tool may be utilized to press on an opposed second side of the geometric-shaped ring, deforming the geometric-shaped ring until one or more wedges of the base of the second side of the geometric-shaped ring fit into the gap between the substrate and the integrated circuit package. The tool-assisted deformation embodiment of the geometric-shaped ring could include one or both of the deformations shown in FIGS. 4B and 4C, for example. These actions secure the geometric-shaped ring made of electromagnetic energy absorbing material to the integrated circuit package.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electromagnetic interference absorber for an integrated circuit, comprising:
    a geometric ring of electromagnetic energy absorbing material, dimensioned to fit over a ball grid array (BGA) integrated circuit package assembled on a substrate; and
    the geometric ring having at least one projection arranged to fit into a gap between the substrate and a body of the BGA integrated circuit package so as to retain the geometric ring to the BGA integrated circuit package.

2. The electromagnetic interference absorber of claim 1, wherein the at least one projection comprises one or more wedges extending inward from a base of the geometric ring.

3. The electromagnetic interference absorber of claim 1, further comprising:
    the geometric ring having an inward facing lip around an upper, inner perimeter of the geometric ring, the inward facing lip arranged to seat to a top of the BGA integrated circuit package.

4. The electromagnetic interference absorber of claim 1, wherein the electromagnetic energy absorbing material comprises ferrite in thermoplastic.

5. The electromagnetic interference absorber of claim 1, wherein at least one inner side facing surface has a post extending inward.

6. The electromagnetic interference absorber of claim 1, wherein opposing sides of the geometric ring each have one or more wedges arranged to fit into the gap between the substrate and the body of the BGA integrated circuit package, and wherein the opposing sides each have a post extending inward.

7. The electromagnetic interference absorber of claim 1, further comprising:
    the geometric ring having an upper rim with one or more notches or projections arranged to engage an assembly tool.

8. The electromagnetic interference absorber of claim 1, wherein the geometric ring is configured to deform to fit over the BGA integrated circuit package.

9. The electromagnetic interference absorber of claim 1, wherein the geometric ring is retained without adhesive.

10. The electromagnetic interference absorber of claim 1, wherein the geometric ring has a rectangular shape.

11. The electromagnetic interference absorber of claim 5, wherein the post inhibits vibration of the geometric ring.

12. The electromagnetic interference absorber of claim 1, wherein the geometric ring surrounds a peripheral side edge of the integrated circuit package.

13. The electromagnetic interference absorber of claim 1, wherein the geometric ring secures a heat sink to the integrated circuit package.

14. The electromagnetic interference absorber of claim 1, wherein the electromagnetic energy absorbing material is molded into the geometric ring.

* * * * *